United States Patent
Bellorado et al.

(10) Patent No.: US 9,124,299 B1
(45) Date of Patent: Sep. 1, 2015

(54) FIXED-POINT DETECTOR PRUNING FOR CONSTRAINED CODES

(71) Applicant: SK hynix memory solutions inc., San Jose, CA (US)

(72) Inventors: Jason Bellorado, San Jose, CA (US); Marcus Marrow, San Jose, CA (US); Zheng Wu, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 231 days.

(21) Appl. No.: 13/852,926

(22) Filed: Mar. 28, 2013

Related U.S. Application Data

(60) Provisional application No. 61/620,259, filed on Apr. 4, 2012.

(51) Int. Cl.
  *H03M 13/03* (2006.01)
  *H03M 13/25* (2006.01)
  *H03M 13/39* (2006.01)
  *H03M 13/41* (2006.01)

(52) U.S. Cl.
  CPC ............ *H03M 13/256* (2013.01); *H03M 13/41* (2013.01); *H03M 13/4169* (2013.01); *H03M 13/42* (2013.01)

(58) Field of Classification Search
  CPC .................................................... H04L 1/0054
  USPC ........................................... 714/794–796, 792
  See application file for complete search history.

(56) References Cited

U.S. PATENT DOCUMENTS

| | | | | |
|---|---|---|---|---|
| 6,212,661 B1* | 4/2001 | Rub et al. | ....................... | 714/769 |
| 6,708,308 B2* | 3/2004 | De Souza et al. | ............. | 714/795 |
| 6,788,750 B1* | 9/2004 | Reuven et al. | ................ | 375/341 |
| 7,088,764 B2* | 8/2006 | Kaewell, Jr. | ................... | 375/140 |
| 7,346,836 B2* | 3/2008 | Ozdemir | ........................ | 714/795 |
| 7,426,681 B2* | 9/2008 | Yamamoto | .................... | 714/794 |
| 7,590,927 B1* | 9/2009 | Shih et al. | ...................... | 714/795 |
| 7,831,893 B2* | 11/2010 | Norris et al. | .................. | 714/792 |
| 8,433,975 B2* | 4/2013 | Hekstra et al. | ................ | 714/760 |
| 8,548,102 B2* | 10/2013 | Doan et al. | ..................... | 375/341 |
| 8,599,959 B2* | 12/2013 | Krachkovsky et al. | ........ | 375/295 |
| 8,904,266 B2* | 12/2014 | Tang et al. | ..................... | 714/795 |
| 2009/0089648 A1* | 4/2009 | Tsui et al. | ..................... | 714/795 |

* cited by examiner

*Primary Examiner* — Esaw Abraham
(74) *Attorney, Agent, or Firm* — Van Pelt, Yi & James LLP

(57) ABSTRACT

A set of branch metrics for a trellis associated with a Viterbi detector is generated. A set of path metrics associated with the trellis is generated based at least in part on the set of branch metrics, including by obtaining a pruned trellis by removing at least some portion of the trellis that is associated with an invalid bit sequence not permitted by a constrained code. A surviving path associated with the pruned trellis is selected based at least in part on the set of path metrics. A sequence of decisions associated with the surviving path is output.

17 Claims, 13 Drawing Sheets

| Branch | Bit Sequence $(b_{k-4}, b_{k-3}, b_{k-2}, b_{k-1}, b_k)$ | Violates MTR 2? | Violates RLL 4? |
|---|---|---|---|
| 0 | (0, 0, 0, 0, 0) | | Yes |
| 1 | (0, 0, 0, 0, 1) | | |
| 2 | (0, 0, 0, 1, 0) | | |
| 3 | (0, 0, 0, 1, 1) | | |
| 4 | (0, 0, 1, 0, 0) | | |
| 5 | (0, 0, 1, 0, 1) | Yes | |
| 6 | (0, 0, 1, 1, 0) | | |
| 7 | (0, 0, 1, 1, 1) | | |
| 8 | (0, 1, 0, 0, 0) | | |
| 9 | (0, 1, 0, 0, 1) | | |
| 10 | (0, 1, 0, 1, 0) | Yes | |
| 11 | (0, 1, 0, 1, 1) | Yes | |
| 12 | (0, 1, 1, 0, 0) | | |
| 13 | (0, 1, 1, 0, 1) | | |
| 14 | (0, 1, 1, 1, 0) | | |
| 15 | (0, 1, 1, 1, 1) | | |

FIG. 2

FIXED-POINT DETECTOR PRUNING FOR CONSTRAINED CODES

CROSS REFERENCE TO OTHER APPLICATIONS

This application claims priority to U.S. Provisional Patent Application No. 61/620,259 entitled FIXED-POINT DETECTOR PRUNING FOR CONSTRAINED CODES filed Apr. 4, 2012 which is incorporated herein by reference for all purposes.

BACKGROUND OF THE INVENTION

Constrained codes are becoming increasingly popular in storage systems, such as hard disk drive storage systems. One example of a constrained code is a maximum transition run (MTR) code. MTR codes limit the number of consecutive transitions in a bit sequence. For example, the bit sequence (0, 1, 0, 1) has 3 transitions (i.e., a low-to-high transition, a high-to-low transition, and then a low-to-high transition) and a MTR limit of 2 would cause that bit sequence to be modified since it exceeds the maximum number of consecutive transitions. Another example of a constrained code is a run length limited (RLL) code where the number of consecutive bits with the same value is limited to some maximum. For example, the bit sequence (0, 0, 0, 0) has a run length of 4 (i.e., there are 4 bits in a row with the same value) and a run length limit of 3 would cause that bit sequence to be modified since its run length exceeds the maximum.

When constrained codes are used in storage systems, it is known that certain bit sequences cannot validly occur in the signal read back from storage since the constrained code would have prevented those sequences from being written to storage in the first place. Although some techniques may exist for incorporating this knowledge into a Viterbi detector, issues may arise when a design is actually implemented as a real world product. For example, some techniques may encounter issues when implemented using fixed point and/or modulo arithmetic. New techniques which do not have these issues when implemented in a real world product would be desirable.

BRIEF DESCRIPTION OF THE DRAWINGS

Various embodiments of the invention are disclosed in the following detailed description and the accompanying drawings.

FIG. 2 is a table showing an embodiment of bit sequences with a length of 5, some of which violate a MTR 2 constraint or a RLL 4 constraint.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
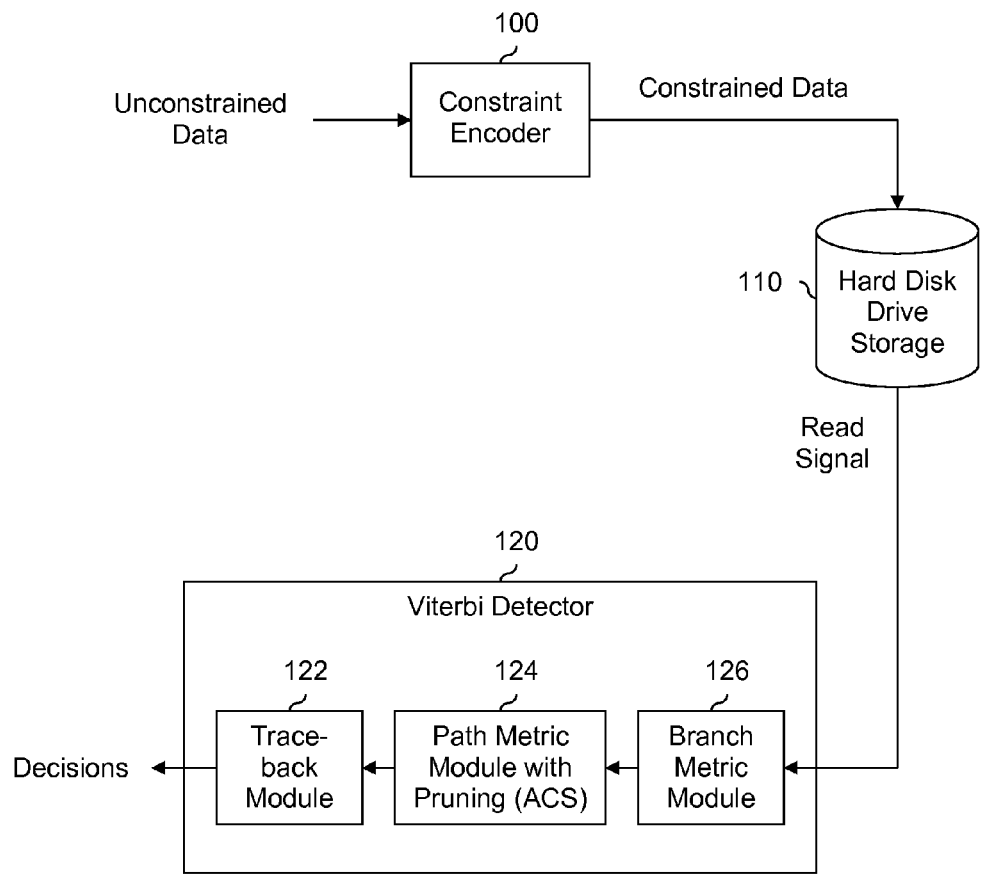
FIG. 1 is a diagram showing an embodiment of a storage system which employs a constrained code.

FIG. 1 is a diagram showing an embodiment of a storage system which employs a constrained code. For clarity, some components which are not necessary to describe the technique are not shown herein. For example, the read signal from hard disk drive storage 110 may be an analog signal and Viterbi detector 120 may be a digital module which expects digital inputs. A real world system may include an analog to digital converter, an equalizer, and/or a timing acquisition block between hard disk drive storage 110 and Viterbi detector 120, but such components are not shown herein. This is not intended to be limiting and a system which performs the techniques described herein may include components not shown in this figure. In some embodiments, constraint encoder 100 and/or Viterbi detector 120 includes or is implemented on a semiconductor device, such as a field programmable gate array (FPGA) or an application specific integrated circuit (ASIC).

In the example shown, before data is written to hard disk drive storage 110, it is passed to constraint encoder 100 which enforces one or more constrained codes on the unconstrained data input to constraint encoder 100. For example, FIG. 2 is a table showing an embodiment of bit sequences with a length of 5, some of which violate a MTR 2 constraint or a RLL 4 constraint. An MTR 2 constraint permits a maximum of 2 transitions in a row. In table 200, the bit sequences (0, 0, 1, 0, 1) (210) and (0, 1, 0, 1, 1) (214) have 3 transitions in a row and the bit sequence (0, 1, 0, 1, 0) (212) has 4 transitions in a row. These bit sequences violate the MTR 2 constraint. The bit sequence (0, 0, 0, 0, 0) (220) has 5 bits in a row with the same value and thus violate the RLL 4 constraint. For brevity, table 200 is redacted and so other bit sequences not shown may also violate the constraints.

Returning to FIG. 1, writing constrained data to hard disk drive storage 110 ensures that certain bit sequences will not be stored in hard disk drive storage 110. Using constrained codes in a storage system may be attractive because it improves system performance. More specifically, Viterbi detector 120 tends to generate more bit errors in the presence of long runs of consecutive transitions and so constraint encoder 100 may enforce a MTR constraint.

In this example, Viterbi detector 120 takes in a read signal and generates decisions. In various embodiments, Viterbi detector 120 may be a soft output/decision Viterbi detector or a hard output/decision Viterbi detector, so soft or hard outputs/decisions may be generated. In this example, Viterbi detector 120 includes branch metric module 126, path metric module with pruning 124, and traceback module 122.

Figure 3:
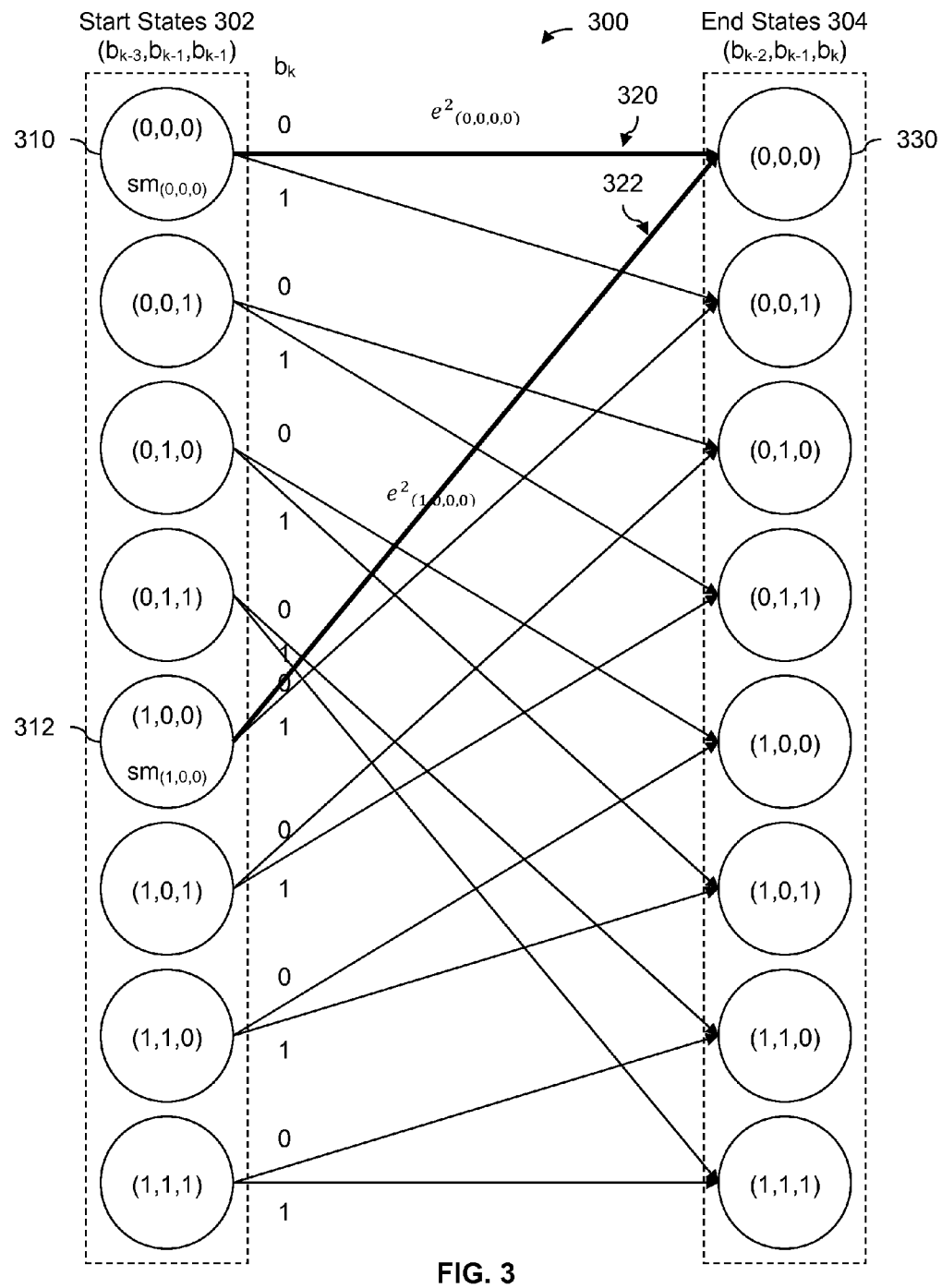
FIG. 3 is a diagram showing an embodiment of a trellis where L=3.

Viterbi detector 120 is a detector utilized for inter symbol interference (ISI) channels and may be described in terms of a finite state machine which, when "rolled out" in time, becomes a trellis. Denoting the ISI length of the channel by L, the channel output at time k may be written as:

$$y_k = \sum_{i=0}^{L-1} T_i \times b_{k-i} + n_k \quad (1)$$

where $b_k$ is the written data sequence, $T_k$ is the target polynomial, and $n_k$ is the noise sequence. At each index or time instance, Viterbi detector 120 first expresses all possible previous bit sequences of length (L−1) (i.e., $(b_{k-L+1}, \ldots, b_{k-1})$) in terms of $2^{L-1}$ start states. FIG. 3 is a diagram showing an embodiment of a trellis where L=3. In diagram 300, start states (302) are shown on the left. Each of start states 302 has an associated accumulated distance metric (not shown in FIG. 3; also referred to as a state metric), which is equivalent to the metric of the smallest distance path from the beginning of the trellis up to that point in time. From each start state, two branches emanate, corresponding to the possibility of $b_k$ being a 0 or a 1. The expected (noiseless) channel output $yT_{(b_{k-L+1}, \ldots, b_k)}$ may be expressed as:

$$yT_{(b_{k-L+1}, \ldots, b_k)} = \sum_{i=0}^{L-1} T_i \times b_{k-i} \quad (2)$$

and the squared deviation (also referred to as the squared error) for each branch (not shown in FIG. 3) can computed as:

$$e^2_{(b_{k-L+1}, \ldots, b_k)} = (yT_{(b_{k-L+1}, \ldots, b_k)} - y_k)^2 \quad (3)$$

Returning to FIG. 1, branch metric module 122 generates branch metrics for each of the branches between start states 302 and end states 304 in FIG. 3. To illustrate the technique, suppose the squared deviation in Equation (3) is the branch metric calculated by branch metric module 122. For branches 320 and 322 (which feed into end state 330 in FIG. 3), branch metrics of $e^2_{(0,0,0,0)}$ and $e^2_{(1,0,0,0)}$, respectively, are calculated.

Path metric module with pruning 124 in FIG. 1 uses the branch metrics calculated by branch metric module 122 to calculate path metrics. Using end state 330 in FIG. 3 as an example, the squared error for each incoming branch into end state 330 is added to the state metric of the start state from which that incoming branch came from. For starting state 310 and branch 320, this corresponds to a sum or path metric of $sm_{(0,0,0)} + e^2_{(0,0,0,0)}$ and for starting state 312 and branch 322, this corresponds to a sum or path metric of $sm_{(1,0,0)} + e^2_{(1,0,0,0)}$. After addition, a comparison is made (e.g., $(sm_{(0,0,0)} + e^2_{(0,0,0,0)})$ versus $(sm_{(1,0,0)} + e^2_{(1,0,0,0)})$) and the incoming branch to end state 330 with the lowest metric (which in this example indicates the highest probability) is selected. The unselected branch is discarded.

In addition to calculating path metrics (e.g., using an add, compare, and select process as described above), path metric module with pruning 124 also generates a pruned trellis using a pruning process. An example of a pruning process performed by path metric module with pruning 124 is described in further detail below.

Traceback module 122 uses the path metrics and pruned trellis generated by path metric module with pruning 124 and outputs a sequence of soft or hard decisions corresponding to each branch in the single surviving path (e.g., decides that a particular bit is a 0 or 1).

Some other techniques (in contrast to the technique described herein) have their branch metric module perform pruning. They do this by manipulate the branch metrics output so that certain branches or paths are selected compared to other, undesirable branches or paths. For example, if it is known that a downstream path metric module will select the branch with the lowest sum (e.g., because the branch, state, and/or path metrics represent or are associated with an error, so lower values are better), some other techniques modify their branch metric module to set branch metrics for undesirable branches to a maximum value. To put it another way, they artificially inflate branch metrics for undesirable branches, for example by setting it to some maximum value. If all goes according to plan, this will cause the resulting sum to be very large and a corresponding undesirable path which includes that branch will not be selected.

The problem with manipulating branch metrics in order to cause a path metric module to pick a certain path is that when it is implemented in some real world systems, it does not work as designed. This is because the addition of the state metric and the branch metric in many path metric modules is often implemented using modulo arithmetic with fixed point precision. For example, if 4 bits are available to represent the sum (e.g., corresponding to values between 0 and 15), a value or sum of 16 would wrap around to 0. Values can wrap around to zero as a result of the modulo operation and still maintain their ordering so long as the maximum and minimum values differ by (for this 4-bit example) no more than 7. The following figure illustrates this problem where this distance or separation is not maintained and the modulo represented values lose their proper greater than/less than relationship.

Figure 4:
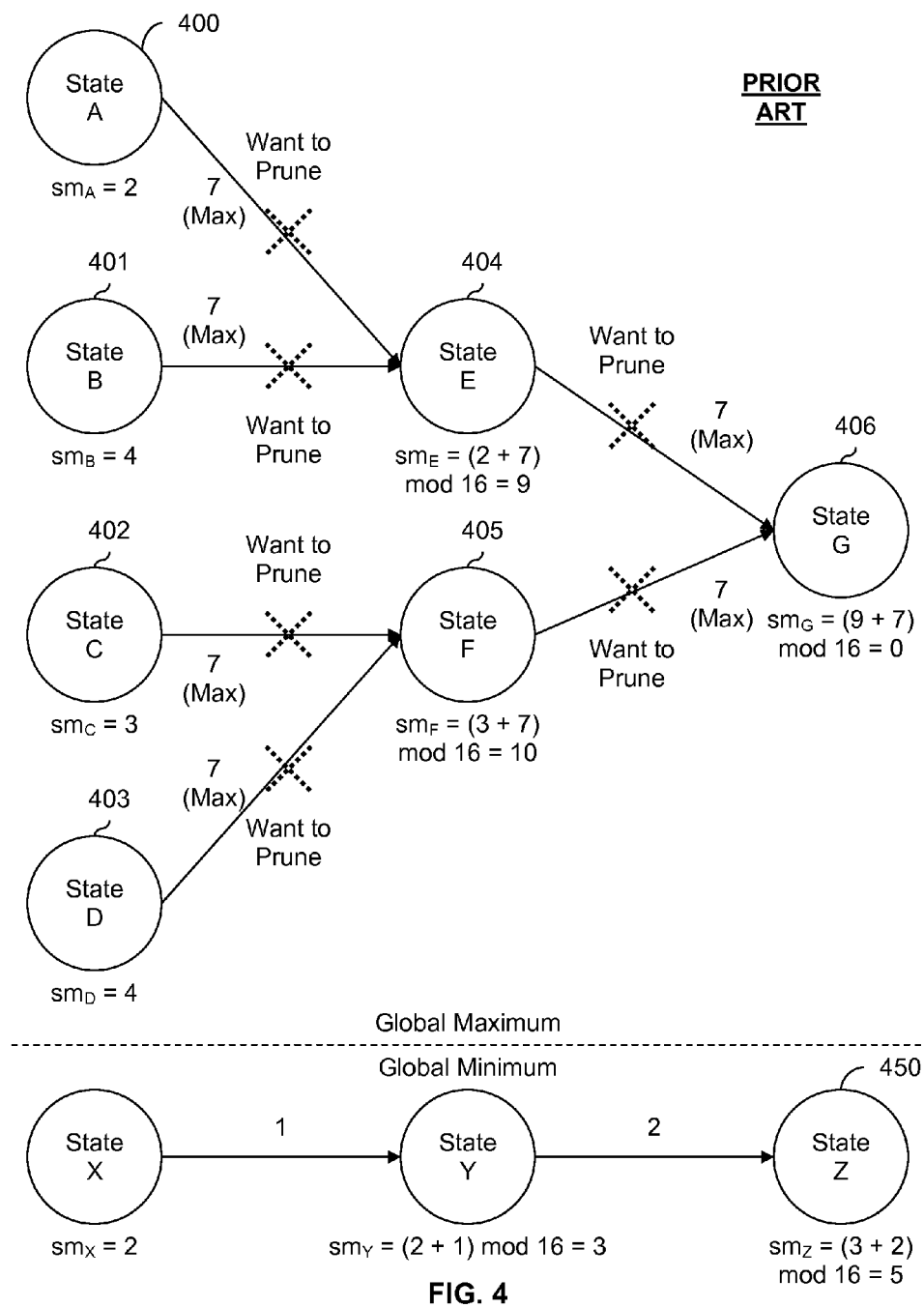
FIG. 4 is a diagram showing an example of a portion of a trellis with multiple pruned branches clustered together.

FIG. 4 is a diagram showing an example of a portion of a trellis with multiple pruned branches clustered together. It is known that the branches between states 400-406 should be pruned (e.g., because they correspond to a sequence of bits which would not have been permitted by a constraint encoder). Each of the branch metrics between each pair of states 400-406 is (per this other technique) set to the maximum branch metric value of 7. In this example, 4 bits are allocated to represent the metrics (i.e., sums), so a modulo 16 operation is performed on each sum. States A-G are associated with a global maximum and states X-Z are associated with a global minimum. For brevity, unselected branches associated with states X-Z which do not affect the outcome are not shown.

At state 404, a comparison is made between (2+7) mod 16 (corresponding to the branch coming from state 400) and (4+7) mod 16 (corresponding to the branch coming from state 401). The first sum is lower so the state metric for state 404 is set to 9 and the branch from state 400 is selected.

At state 405, a comparison is made between (3+7) mod 16 (corresponding to the branch coming from state 402) and (4+7) mod 16 (corresponding to the branch coming from state 403). Since the first sum is lower, the state metric for state 405 is set to 10 and the branch from state 402 is selected.

At state 406, a comparison is made between (9+7) mod 16 (corresponding to the branch coming from state 404) and (10+7) mod 16 (corresponding to the branch coming from state 403). Since the first sum (after the modulo operation) is 0 and the second sum (after the modulo operation) is 1, the first sum is selected and the state metric for state 406 is set to 0.

Note that the state metric for state G (406) is now less than that for state Z (450), at least as represented using 4 bits. This change in the ordering is improper and the state metric for state Z (450) should in fact be less than that for the state metric for state G (406). However, because the state metrics have violated the minimum distance requirement (i.e., they can differ by no more than 7 in order for the proper ordering to be maintained), the proper ordering is lost. As a result of this, states 400-406 and the branches between them (which were supposed to have been pruned as a result of setting the branch metrics to the maximum value) are now selected since they appear to have the best (in this case, lowest) metric. This is undesirable since the selected path will pass through states and branches which should have been pruned.

Although one solution to this problem is to increase the number of bits used to represent the metrics/sums, this undesirable because of the amount of additional routing space consumed in a semiconductor device. Adding bits is thus not a practical solution in real world systems. As such, having path metric module with pruning 124 in FIG. 1 perform pruning of illegal or invalid states, sequences, and/or paths (instead of using a branch metric module to inflate or (more generally) manipulate branch metric values in hopes that a path metric module will select certain paths) is a better solution for fixed point Viterbi detectors which attempt to incorporate knowledge of constrained codes into its processing.

Figure 5:
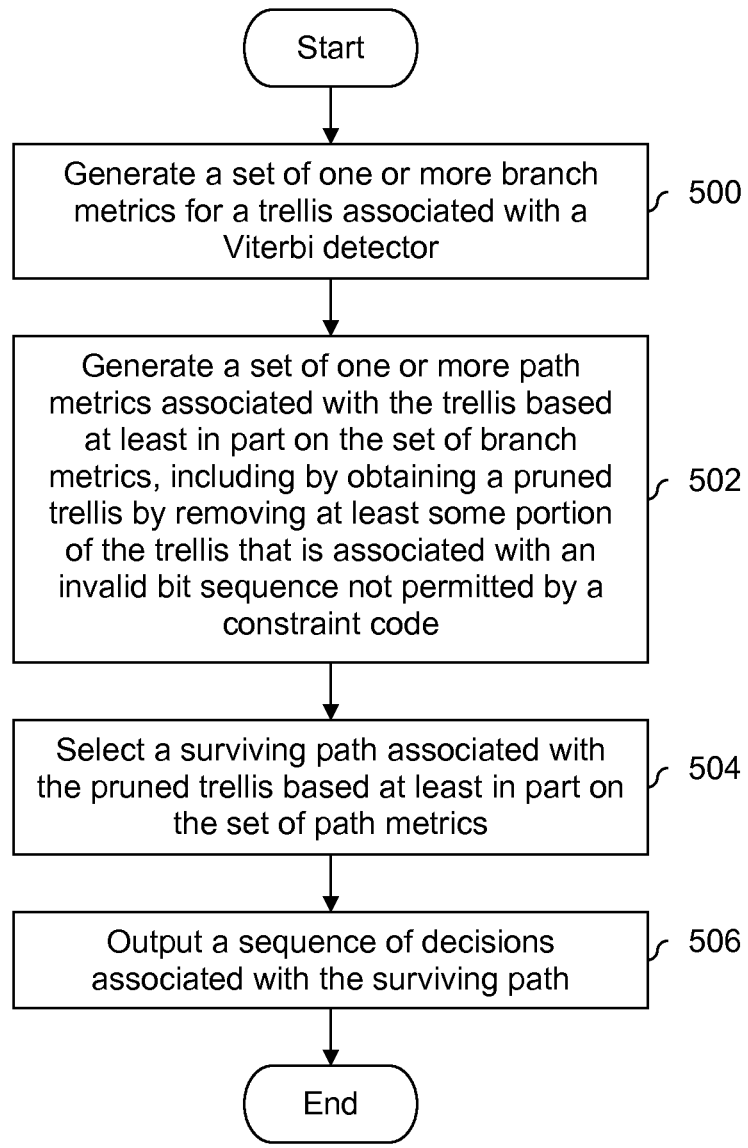
FIG. 5 is a flowchart illustrating an embodiment of a process for performing Viterbi detection where pruning is performing during path metric generation.

FIG. 5 is a flowchart illustrating an embodiment of a process for performing Viterbi detection where pruning is performing during path metric generation. In one example, Viterbi detector 120 in FIG. 1 performs the example process shown.

At 500, a set of one or more branch metrics is generated for a trellis associated with a Viterbi detector. For example, branch metric module 126 in FIG. 1 may perform this step and generates branch metrics for all branches in a trellis. Pruning of the trellis has not yet been performed at this stage and so the trellis operated on may include all branches and/or states. Also, since pruning is not performed at this stage, a branch metric module does not necessarily have to be modified (e.g., to incorporate knowledge of the constrained code(s) into its processing).

At 502, a set of one or more path metrics associated with the trellis is generated based at least in part on the set of branch metrics, including by obtaining a pruned trellis by removing at least some portion of the trellis that is associated with an invalid bit sequence not permitted by a constrained code. For example, path metric module with pruning 124 in FIG. 1 may perform this step. In some embodiments, a branch (e.g., between two states) is pruned. In some embodiments, a state is pruned. An example of how a trellis is pruned to obtain a pruned trellis is described in further detail below.

At 504, a surviving path associated with the pruned trellis is selected based at least in part on the set of path metrics. A sequence of decisions associated with the surviving path is output at 506. For example, in FIG. 1, traceback module 122 performs steps 504 and 506 using a pruned trellis and path metrics output by path metric module with pruning 124. Decisions output by Viterbi detector 120 may correspond to a decision about what the original constrained data at the output of constraint encoder 100 was, prior to being stored in hard disk drive storage 110. Note that although FIG. 1 shows a storage system, the process of FIG. 5 may be used in any system (e.g., a communications system).

Figure 6:
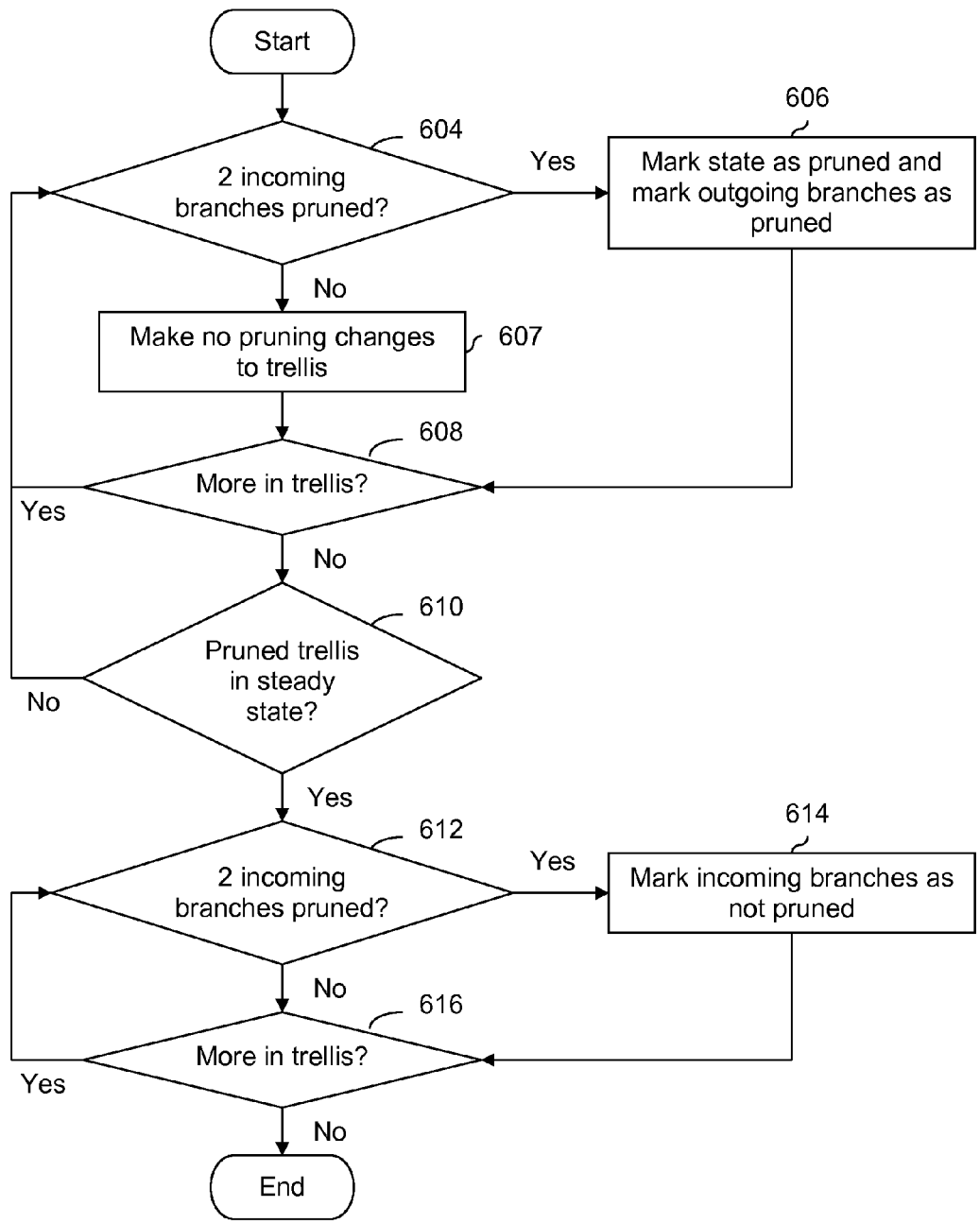
FIG. 6 is a flowchart illustrating an embodiment of a process for generating a pruned trellis during path metric generation.

FIG. 6 is a flowchart illustrating an embodiment of a process for generating a pruned trellis during path metric generation. For example, step 502 in FIG. 5 in some embodiments includes the example process shown and/or path metric module with pruning 124 in FIG. 1 performs the example process. Alternatively, in some other embodiments, some other process is used to generate a pruned trellis at step 502 in FIG. 5. The process shown herein is merely exemplary and is not intended to be limiting.

The example of FIG. 6 applies to concatenated codes. For example, a sector may be 40,000 bits long, but the codeword length of the constrained code is much shorter (e.g., 54 bits). Each block of 51 bits is encoded into 54 bits, and then the codewords are concatenated with each other to form a sector (e.g., of 40,000 bits). Thus, it is possible to consider only a single trellis of length 54, which is continually repeated for each of the constrained code's codewords. Since these trellises are placed one after another, the end of one trellis abuts the start of the next. So, the procedure cyclically passes through this length-54 trellis, and any modifications made to the final stage will then feedback through to the first stage of the trellis. In other words, in such concatenated systems, the leftmost states in the trellis and the rightmost states in the trellis are actually the same states (e.g., it wraps around to the beginning of the next codeword).

Figure 7:
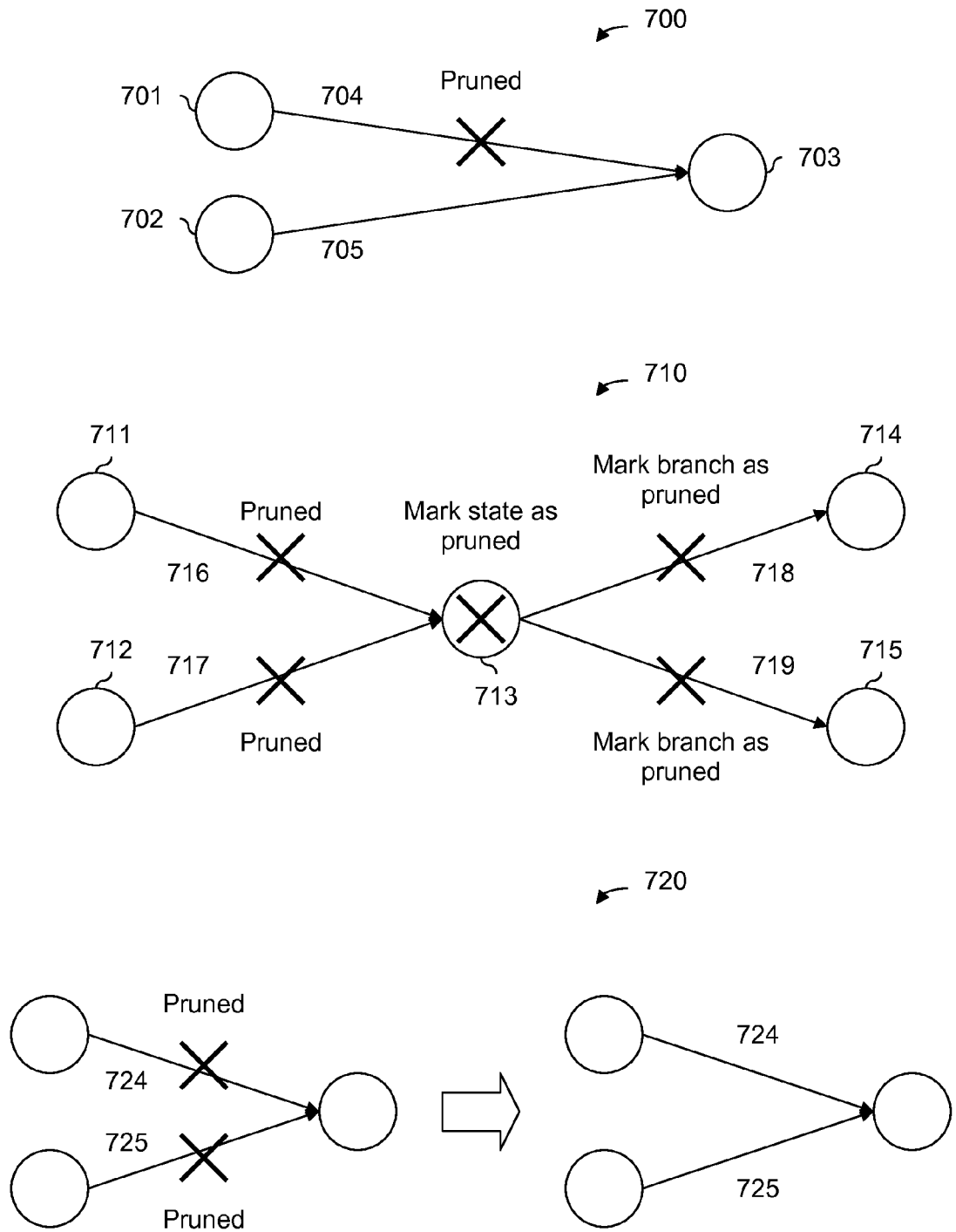
FIG. 7 is a diagram showing an embodiment of trellis pruning rules.

At 604, it is determined if two incoming branches are pruned. FIG. 7 is a diagram showing an embodiment of trellis pruning rules. Diagram 700 is an example where a single incoming branch (e.g., going into state 703) is pruned (e.g., branch 704 is pruned but branch 705 is not pruned). Diagram 710 is an example where both incoming branch 716 and incoming branch 717 (e.g., into state 713) are pruned. Returning to FIG. 7, if at 604 it is determined that both incoming branches are pruned, then the state is marked as pruned and the outgoing branches are marked as pruned at 606. In diagram 710 in FIG. 7, for example, state 713 is marked as pruned and outgoing branches 718 and 719 are marked as pruned. If at 604 it is determined that no incoming branches are pruned or only a single incoming branch is pruned, then no pruning changes are made to the trellis at 607.

After step 606 or step 607, it is determined if there are more objects in a trellis at 608. For example, if there are more states in the trellis which remain to be processed in the iteration or pass, then process goes from the decision at 608 to the decision at 604.

If it is determined at 608 that there are no more objects in the trellis, it is determined at 610 if a pruned trellis is in a steady state. For example, it may be decided that a pruned trellis is in a steady state if the entire trellis has been processed and no changes were made to the trellis in the last pass or iteration (e.g., in terms of which states are pruned and/or which branches are pruned). If it is determined at 610 that the pruned trellis is not in a steady state, the process returns to the decision at 604 (e.g., the process keeps working on the pruned trellis until a steady state is reached).

If it is determined at 610 that the pruned trellis is in a steady state, then it is determined at 612 if two incoming branches are pruned. If so, the incoming branches are marked as not pruned. In diagram 720 in FIG. 7, branches 724 and 725 are both pruned and the status is changed from pruned to not pruned. Since the two branches evaluated at 604 are not necessarily the same as in 612, the two incoming branches evaluated at 604 may be referred to as a first and second incoming branch, and the incoming branches evaluated at 612 may be referred to as a third and fourth incoming branch. Note that step 606 is associated with marking outgoing branches are pruned, whereas step 614 is associated with marking incoming branches as not pruned.

After step 614 or if it is determined at 612 that two incoming branches are not pruned or, it is determined at 616 if there are more objects in a trellis. If so, the process returns to the decision at 612. For example, if other states and/or branches remain to be processed, the process continues.

Figure 12:
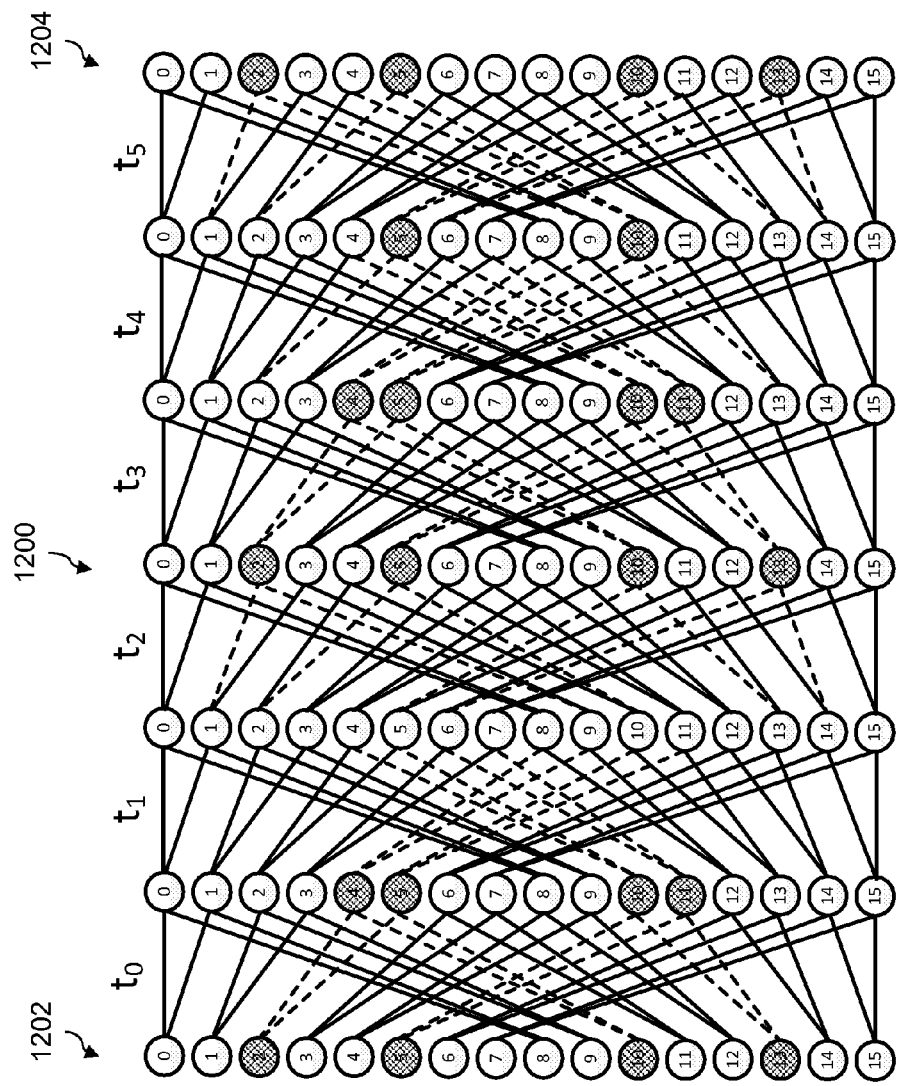
FIG. 12 is a diagram showing an embodiment of a pruned trellis at a fifth point in time and in a steady state.

At 604, when a trellis stage is being processed there are 3 possibilities: none of the incoming branches are pruned, only one of the incoming branches are pruned, or both of the incoming branches are pruned. If only zero or one incoming branch going into a state is pruned, then no change is fed forward to the next trellis stage. Only when both incoming branches are pruned is that state is pruned, which amounts to pruning both of the outgoing branches from that state. This feed-forward mechanism is continued until the process is able to go through the trellis at least once without making any new (e.g., additional) changes to the trellis. This corresponds to a steady state (e.g., checked for at 610); one example is shown in FIG. 12. Note that in FIG. 12, every state with 2 pruned incoming branches also has 2 pruned outgoing branches, so there will be no changes that are made there.

Figure 13:
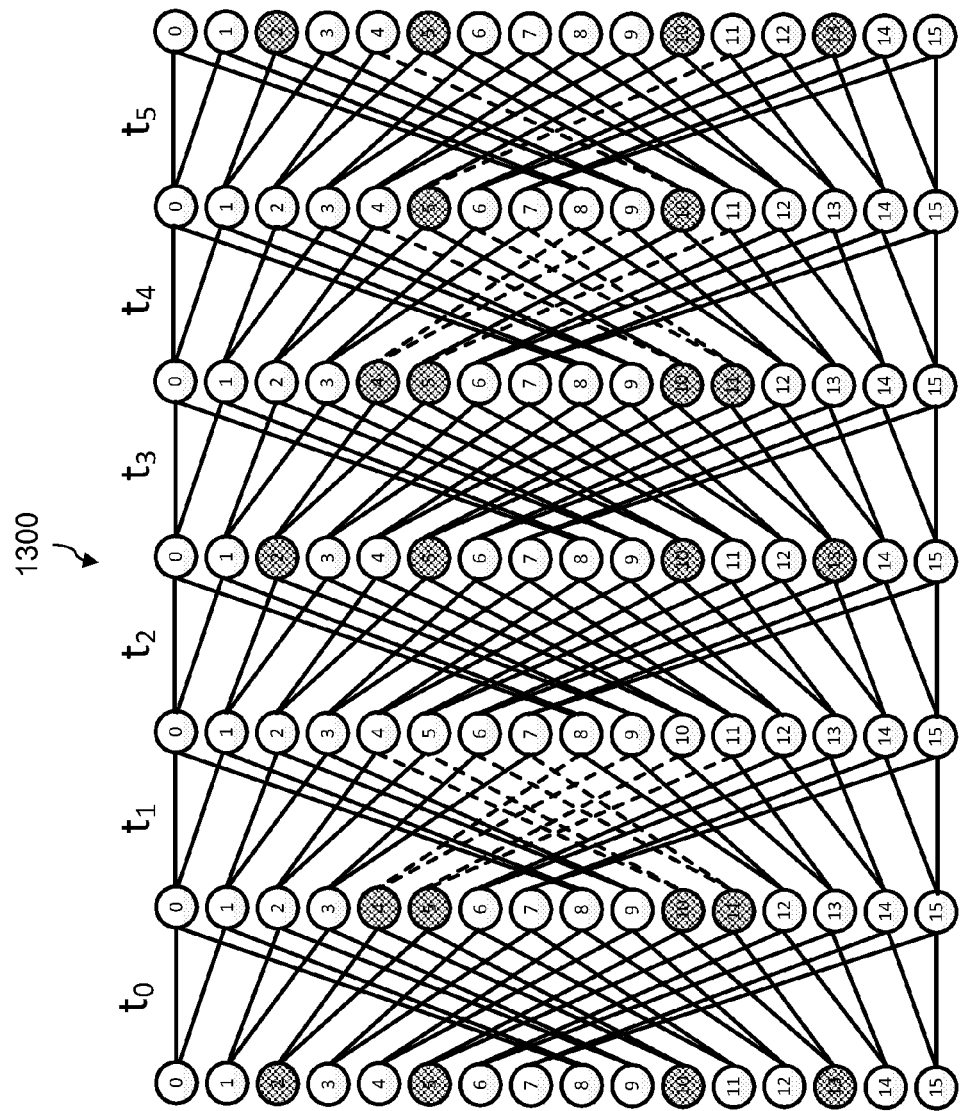
FIG. 13 is a diagram showing an embodiment of a final pruned trellis.

The "clean up" portion of FIG. 6 (e.g., corresponding to steps 612, 614 and 616 and shown in the example changes between FIG. 12 and FIG. 13), is a recognition of the fact that we have already fed forward the fact that a state is pruned to the next trellis stage. Thus, any pruned state (i.e., a state with 2 pruned incoming branches) can have both of its incoming branches restored (i.e., unpruned them). "Clean up" steps 612, 614, and 616 are useful because they act to obviate or mitigate issues related to state metric wrapping (e.g., shown in FIG. 4), which is caused by having states with both incoming branches pruned.

The following figures show an example of the process described in FIG. 6 applied to a complete trellis. Note that the size of the trellis shown is merely exemplary and a trellis of any size may be processed using the process of FIG. 6.

Figure 8:
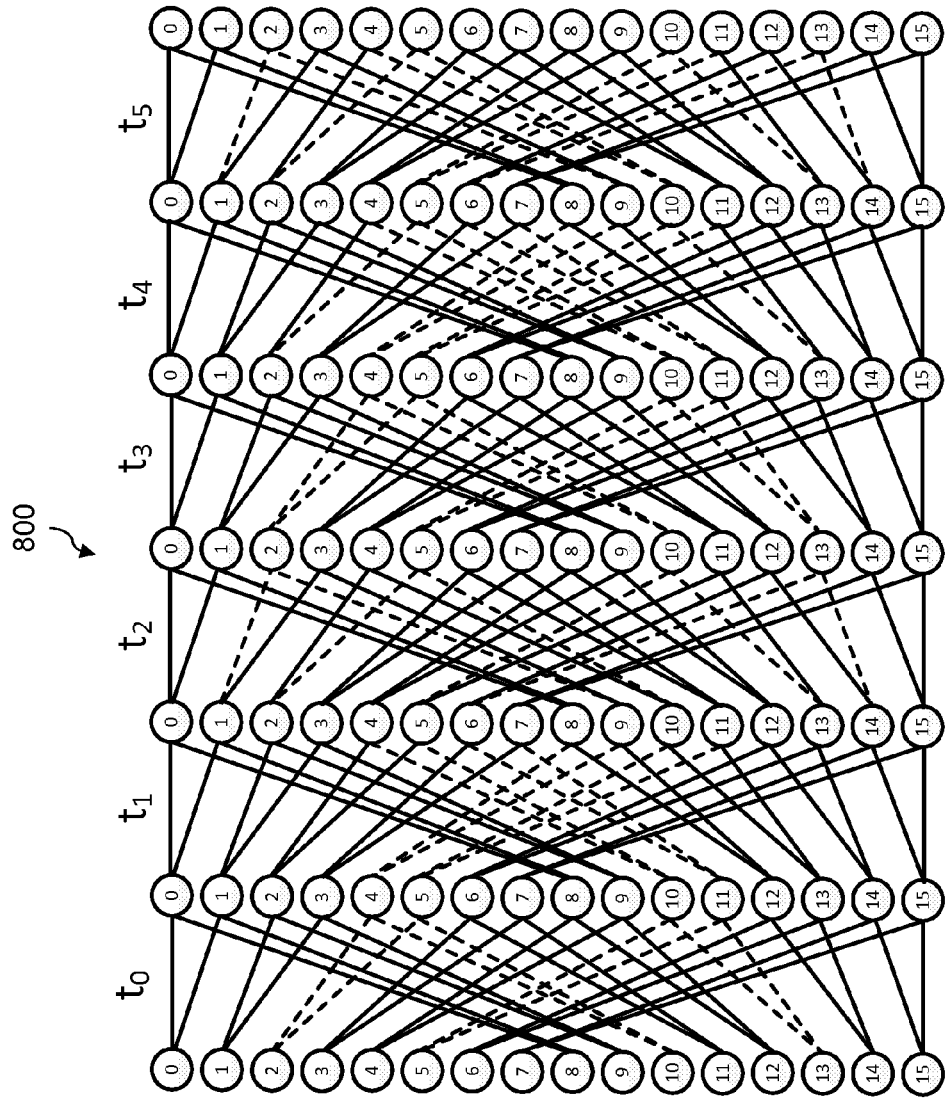
FIG. 8 is a diagram showing an embodiment of a trellis with branches pruned due to one or more constrained codes.

FIG. 8 is a diagram showing an embodiment of a trellis with branches pruned due to one or more constrained codes. Trellis 800 has a length of 6 (and thus times or indices $t_0$-$t_5$ are shown) and the trellis is in an initial state prior to processing by FIG. 6.

Branches which are associated with bit sequences which violate at least one of the constrained codes are shown in trellis 800 with dashed lines. For the purposes of describing the technique, it is not necessary to explain the constrained codes in detail and for brevity the constrained codes are not described in detail herein.

For convenience, branches are uniquely numbered or labeled using the following system:

$$Br_{(b_{k-4},b_{k-3},b_{k-2},b_{k-1},b_k)} = \sum_{i=0}^{4} b_{k-i} \times 2^i \quad (4)$$

Graphically, this corresponds to going down a column of states and numbering the outgoing branches encountered beginning with branch number 0.

As such, the pruned branches in trellis 800 are:

TABLE 1

Pruned branches in FIG. 8.

| Time | Pruned Branches |
|---|---|
| $t_0$ | 4, 5, 10, 11, 20, 21, 26, 27 |
| $t_1$ | 8, 9, 10, 11, 20, 21, 22, 23 |
| $t_2$ | 2, 5, 10, 13, 18, 21, 26, 29 |
| $t_3$ | 4, 5, 10, 11, 20, 21, 26, 27 |
| $t_4$ | 5, 8, 9, 10, 11, 20, 21, 22, 23, 26 |
| $t_5$ | 2, 5, 10, 11, 13, 18, 20, 21, 26, 29 |

There are no pruned states, at least as of yet, in diagram 800.

Figure 9:
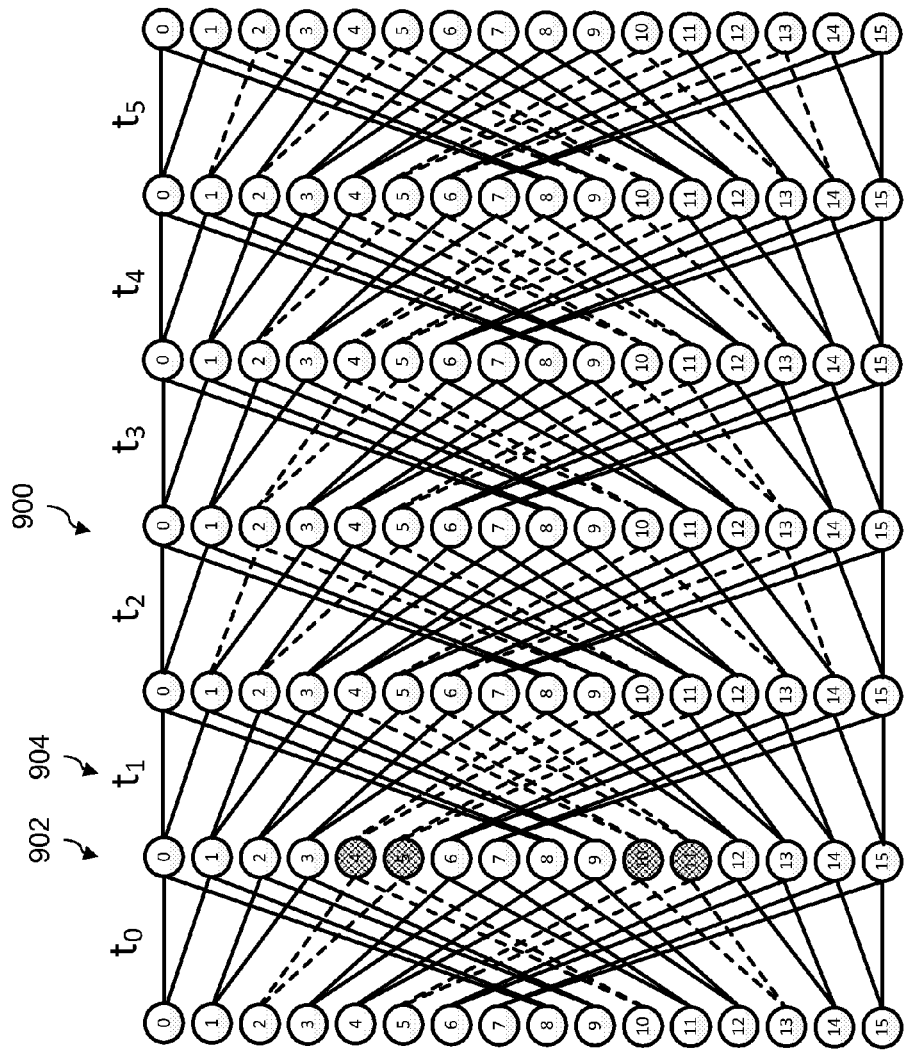
FIG. 9 is a diagram showing an embodiment of a pruned trellis at a second point in time.

FIG. 9 is a diagram showing an embodiment of a pruned trellis at a second point in time. Trellis 900 has had the states in column 902 and the branches in column 904 processed according to FIG. 6. In column 902, states 4, 5, 10, and 11 have been marked as pruned (shaded) because both of the incoming branches to those states are pruned. This corresponds to step 606 in FIG. 6. Also, as a result of states 4, 5, 10, and 11 in column 902 being pruned, the outgoing branches from those states are also marked as pruned (also part of step 606 in FIG. 6). In this particular example, those outgoing branches were already pruned (see, e.g., trellis 800 in FIG. 8) so there is no effective change to the set of pruned branches.

TABLE 2

Pruned branches and states in FIG. 9.

| Time | Pruned Branches | Time | Pruned States |
|---|---|---|---|
| $t_0$ | 4, 5, 10, 11, 20, 21, 26, 27 | Before $t_0$ | |
| $t_1$ | 8, 9, 10, 11, 20, 21, 22, 23 | Between $t_0$ and $t_1$ | 4, 5, 10, 11 |
| $t_2$ | 2, 5, 10, 13, 18, 21, 26, 29 | Between $t_1$ and $t_2$ | |
| $t_3$ | 4, 5, 10, 11, 20, 21, 26, 27 | Between $t_2$ and $t_3$ | |
| $t_4$ | 5, 8, 9, 10, 11, 20, 21, 22, 23, 26 | Between $t_3$ and $t_4$ | |
| $t_5$ | 2, 5, 10, 11, 13, 18, 20, 21, 26, 29 | Between $t_4$ and $t_5$ | |
| | | After $t_5$ | |

Figure 10:
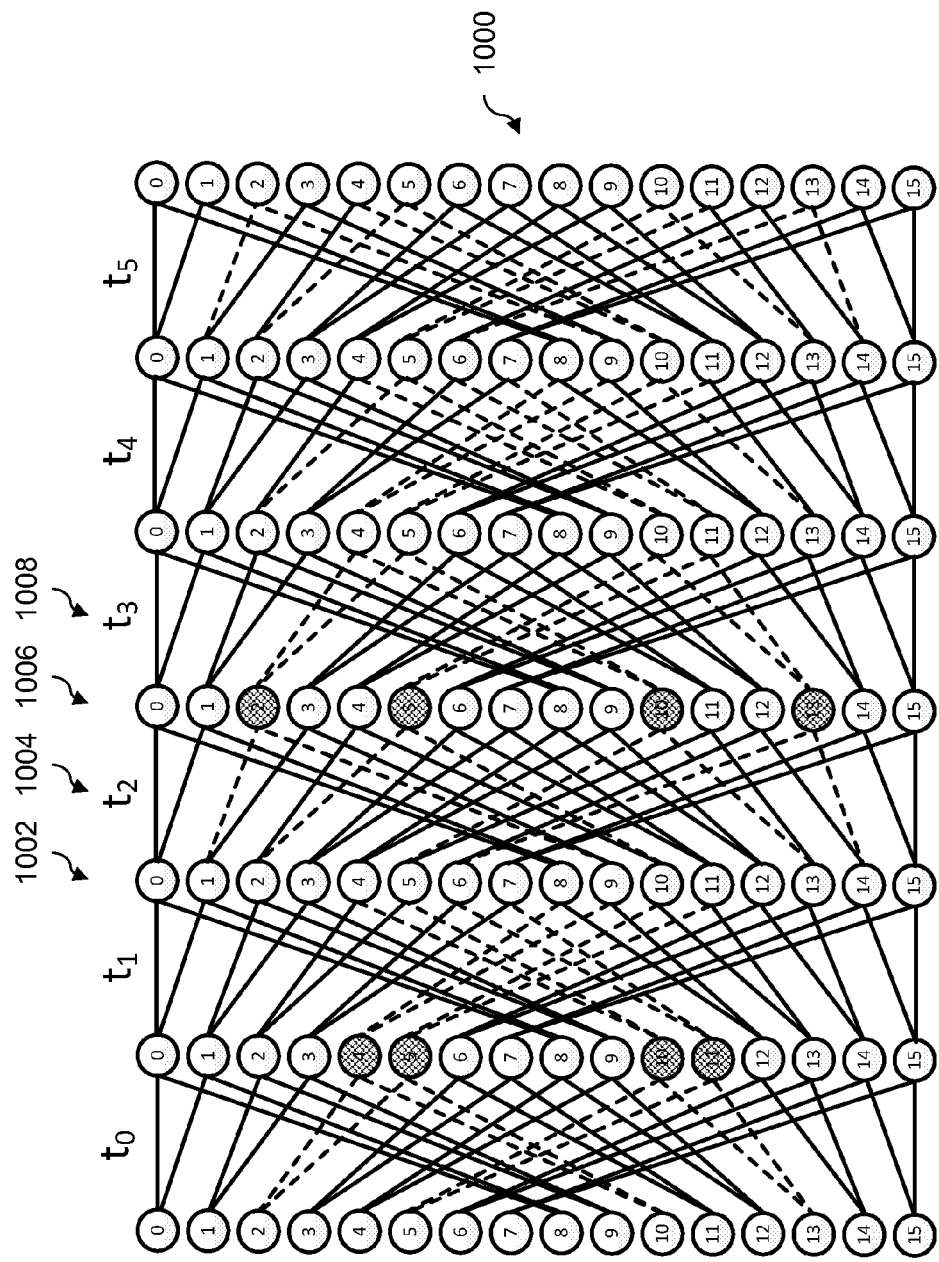
FIG. 10 is a diagram showing an embodiment of a pruned trellis at a third point in time.

FIG. 10 is a diagram showing an embodiment of a pruned trellis at a third point in time. In trellis 1000, the states in columns 1002 and 1006 and the branches in columns 1004 and 1008 have been processed according to FIG. 6. In column 1002, no states are pruned because none of the states in that column have two incoming branches which are pruned. Since none of the states in column 1002 are pruned, no outgoing branches (e.g., in addition to those that were already pruned) in column 1004 are pruned.

In column 1006, states 2, 5, 10, and 13 are pruned since those states have two incoming branches which are pruned (e.g., corresponding to step 606 in FIG. 6). The branches in column 1008 which come from pruned states 2, 5, 10, and 13 in column 1006 are marked as pruned (e.g., corresponding to step 606 in FIG. 6). However, since all of those branches were already pruned, there is no effective change to the pruned branches in column 1008.

TABLE 3

Pruned branches and states in FIG. 10.

| Time | Pruned Branches | Time | Pruned States |
|---|---|---|---|
| $t_0$ | 4, 5, 10, 11, 20, 21, 26, 27 | Before $t_0$ | |
| $t_1$ | 8, 9, 10, 11, 20, 21, 22, 23 | Between $t_0$ and $t_1$ | 4, 5, 10, 11 |
| $t_2$ | 2, 5, 10, 13, 18, 21, 26, 29 | Between $t_1$ and $t_2$ | |
| $t_3$ | 4, 5, 10, 11, 20, 21, 26, 27 | Between $t_2$ and $t_3$ | 2, 5, 10, 13 |
| $t_4$ | 5, 8, 9, 10, 11, 20, 21, 22, 23, 26 | Between $t_3$ and $t_4$ | |
| $t_5$ | 2, 5, 10, 11, 13, 18, 20, 21, 26, 29 | Between $t_4$ and $t_5$ | |
| | | After $t_5$ | |

Figure 11:
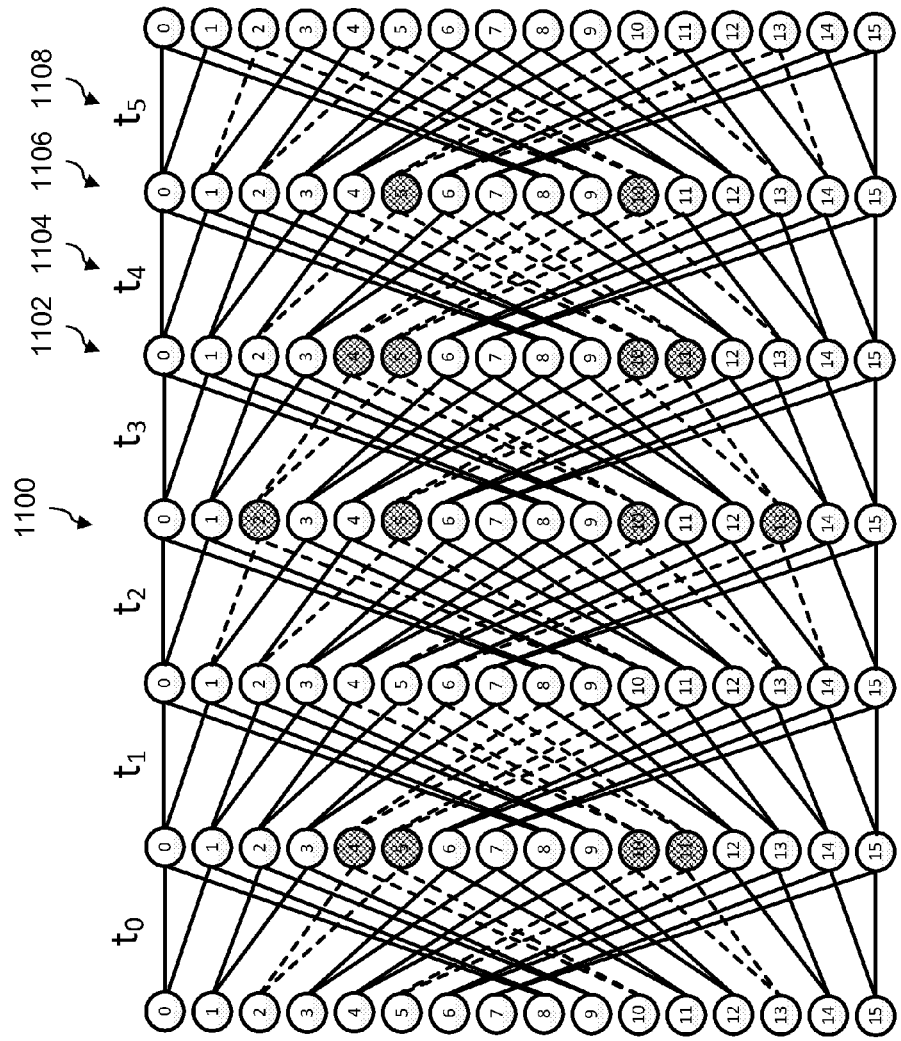
FIG. 11 is a diagram showing an embodiment of a pruned trellis at a fourth point in time.

FIG. 11 is a diagram showing an embodiment of a pruned trellis at a fourth point in time. In trellis 1100, the states in columns 1102 and 1106 and the branches in columns 1104 and 1108 have been processed. In column 1102, states 4, 5, 10, and 11 have been marked as pruned since both incoming branches to those states are pruned. Outgoing branches in column 1104 from those pruned states in column 1102 are also pruned. In this particular example, those branches in column 1104 were already pruned, so there is no effective change made to the branches in column 1104.

In column 1106, states 5 and 10 are marked as pruned because both of the incoming branches to those states are pruned. Outgoing branches in column 1108 that come from those pruned states are also pruned (those branches in column 1108 were already pruned, so no change is made in column 1108).

TABLE 4

Pruned branches and states in FIG. 11.

| Time | Pruned Branches | Time | Pruned States |
|---|---|---|---|
| $t_0$ | 4, 5, 10, 11, 20, 21, 26, 27 | Before $t_0$ | |
| $t_1$ | 8, 9, 10, 11, 20, 21, 22, 23 | Between $t_0$ and $t_1$ | 4, 5, 10, 11 |
| $t_2$ | 2, 5, 10, 13, 18, 21, 26, 29 | Between $t_1$ and $t_2$ | |
| $t_3$ | 4, 5, 10, 11, 20, 21, 26, 27 | Between $t_2$ and $t_3$ | 2, 5, 10, 13 |
| $t_4$ | 5, 8, 9, 10, 11, 20, 21, 22, 23, 26 | Between $t_3$ and $t_4$ | 4, 5, 10, 11 |
| $t_5$ | 2, 5, 10, 11, 13, 18, 20, 21, 26, 29 | Between $t_4$ and $t_5$ | 5 and 10 |
| | | After $t_5$ | |

FIG. 12 is a diagram showing an embodiment of a pruned trellis at a fifth point in time and in a steady state. In trellis 1200, states 2, 5, 10, and 13 in column 1204 are pruned because both of the incoming branches to those states are pruned. In this example, the constrained codes used are concatenated codes, meaning that a data sector (e.g., stored on hard disk drive storage 110 in FIG. 1) is formed by concatenating together constrained data (e.g., output by constraint encoder 100 in FIG. 1). As a result, the states in column 1202 are coupled to or tied to the corresponding states in column 1204. For example, if a state in the leftmost or rightmost column is (not) pruned, then the corresponding state in the other column is also (not) pruned. For this reason, since states 2, 5, 10, and 13 in column 1204 are pruned, states 2, 5, 10, and 13 in column 1202 reflect this pruning.

Trellis 1200 is in a steady state, corresponding to the transition from step 610 ("Pruned trellis in steady state?") to step 612 in FIG. 6. Once a pruned trellis is in a steady state, the steps of 612, 614, and 616 in FIG. 6 are performed. The following figure shows an example of the final pruned trellis.

TABLE 5

Pruned branches and states in FIG. 12.

| Time | Pruned Branches | Time | Pruned States |
|---|---|---|---|
| $t_0$ | 4, 5, 10, 11, 20, 21, 26, 27 | Before $t_0$ | 2, 5, 10, 13 |
| $t_1$ | 8, 9, 10, 11, 20, 21, 22, 23 | Between $t_0$ and $t_1$ | 4, 5, 10, 11 |
| $t_2$ | 2, 5, 10, 13, 18, 21, 26, 29 | Between $t_1$ and $t_2$ | |
| $t_3$ | 4, 5, 10, 11, 20, 21, 26, 27 | Between $t_2$ and $t_3$ | 2, 5, 10, 13 |
| $t_4$ | 5, 8, 9, 10, 11, 20, 21, 22, 23, 26 | Between $t_3$ and $t_4$ | 4, 5, 10, 11 |
| $t_5$ | 2, 5, 10, 11, 13, 18, 20, 21, 26, 29 | Between $t_4$ and $t_5$ | 5 and 10 |
| | | After $t_5$ | 2, 5, 10, 13 |

FIG. 13 is a diagram showing an embodiment of a final pruned trellis. In the example shown, trellis 1300 has reached a steady state. To go from trellis 1200 in FIG. 12 to trellis 1300 in FIG. 13, if two incoming branches are pruned, the state of those incoming branches is changed from pruned to not pruned since the constraints have already been fed forward in the trellis structure. For the reasons described above, doing a "clean up" after a steady state is reached is useful because it reduces the likelihood of state metrics losing their proper order.

As can be seen by comparing Table 1 and Table 6, the initial set of pruned branches has been reduced in the final pruned trellis.

TABLE 6

Pruned branches and states in FIG. 13.

| Time | Pruned Branches | Time | Pruned States |
|---|---|---|---|
| $t_0$ | | Before $t_0$ | 2, 5, 10, 13 |
| $t_1$ | 8, 9, 10, 11, 20, 21, 22, 23 | Between $t_0$ and $t_1$ | 4, 5, 10, 11 |
| $t_2$ | | Between $t_1$ and $t_2$ | |
| $t_3$ | | Between $t_2$ and $t_3$ | 2, 5, 10, 13 |
| $t_4$ | 8, 9, 11, 20, 22, 23 | Between $t_3$ and $t_4$ | 4, 5, 10, 11 |
| $t_5$ | 11 and 20 | Between $t_4$ and $t_5$ | 5 and 10 |
| | | After $t_5$ | 2, 5, 10, 13 |

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
  a branch metric module configured to generate a set of one or more branch metrics for a trellis associated with a Viterbi detector;
  a path metric module configured to generate a set of one or more path metrics associated with the trellis based at least in part on the set of branch metrics, including by obtaining a pruned trellis by removing at least some portion of the trellis that is associated with an invalid bit sequence not permitted by a constrained code, wherein obtaining the pruned trellis includes:
    determining if two incoming branches to a given state are pruned;
    in the event it is determined that two incoming branches to a given state are pruned, marking the given state as pruned and marking outgoing branches of the given state as pruned;
    determining if the pruned trellis is in a steady state where the entire pruned trellis has been processed and no states or branches were pruned in the last pass of the pruned trellis; and in the event it is determined that the pruned trellis is in a steady state:
  determining if two incoming branches to a given state in the steady-state trellis are pruned; and
  in the event it is determined that two incoming branches to a given state in the steady-state trellis are pruned, marking the two incoming branches to the given state in the steady-state trellis as not pruned so that the two incoming branches to the given state are restored to the steady-state trellis; and
a traceback module configured to:
  select a surviving path associated with the pruned trellis based at least in part on the set of path metrics; and
  output a sequence of decisions associated with the surviving path.

2. The system of claim 1, wherein the branch metric module, the path metric module, and the traceback module include a semiconductor device, including one or more of the following: a field programmable gate array (FPGA) or an application specific integrated circuit (ASIC).

3. The system of claim 1, wherein the sequence of decisions includes one or more of the following a hard decision or a soft decision.

4. The system of claim 1, wherein the constrained code includes at least one of the following: a maximum transition run (MTR) code or a run length limited (RLL) code.

5. The system of claim 1, wherein the constrained code includes a concatenated code.

6. The system of claim 1, wherein:
the constrained code includes a concatenated code; and
the path metric module is configured to obtain the pruned trellis, including by coupling (1) a first state associated with an earliest time in the pruned trellis and (2) a second state, corresponding to the first state, associated with a latest time in the pruned trellis.

7. A method, comprising:
generating a set of one or more branch metrics for a trellis associated with a Viterbi detector;
using a processor to generate a set of one or more path metrics associated with the trellis based at least in part on the set of branch metrics, including by obtaining a pruned trellis by removing at least some portion of the trellis that is associated with an invalid bit sequence not permitted by a constrained code, wherein obtaining the pruned trellis includes:
  determining if two incoming branches to a given state are pruned;
  in the event it is determined that two incoming branches to a given state are pruned, marking the given state as pruned and marking outgoing branches of the given state as pruned;
  determining if the pruned trellis is in a steady state where the entire pruned trellis has been processed and no states or branches were pruned in the last pass of the pruned trellis; and
  in the event it is determined that the pruned trellis is in a steady state:
    determining if two incoming branches to a given state in the steady-state trellis are pruned; and
    in the event it is determined that two incoming branches to a given state in the steady-state trellis are pruned, marking the two incoming branches to the given state in the steady-state trellis as not pruned so that the two incoming branches to the given state are restored to the steady-state trellis;
selecting a surviving path associated with the pruned trellis based at least in part on the set of path metrics; and
outputting a sequence of decisions associated with the surviving path.

8. The method of claim 7, wherein the method is performed by a semiconductor device, including one or more of the following: a field programmable gate array (FPGA) or an application specific integrated circuit (ASIC).

9. The method of claim 7, wherein the sequence of decisions includes one or more of the following a hard decision or a soft decision.

10. The method of claim 7, wherein the constrained code includes at least one of the following: a maximum transition run (MTR) code or a run length limited (RLL) code.

11. The method of claim 7, wherein the constrained code includes a concatenated code.

12. The method of claim 7, wherein:
the constrained code includes a concatenated code; and
obtaining the pruned trellis includes coupling (1) a first state associated with an earliest time in the pruned trellis and (2) a second state, corresponding to the first state, associated with a latest time in the pruned trellis.

13. A computer program product, the computer program product being embodied in a non-transitory computer readable storage medium and comprising computer instructions for:
generating a set of one or more branch metrics for a trellis associated with a Viterbi detector;
generating a set of one or more path metrics associated with the trellis based at least in part on the set of branch metrics, including by obtaining a pruned trellis by removing at least some portion of the trellis that is associated with an invalid bit sequence not permitted by a constrained code, wherein obtaining the pruned trellis includes:
  determining if two incoming branches to a given state are pruned;
  in the event it is determined that two incoming branches to a given state are pruned, marking the given state as pruned and marking outgoing branches of the given state as pruned;
  determining if the pruned trellis is in a steady state where the entire pruned trellis has been processed and no states or branches were pruned in the last pass of the pruned trellis; and
  in the event it is determined that the pruned trellis is in a steady state:
    determining if two incoming branches to a given state in the steady-state trellis are pruned; and
    in the event it is determined that two incoming branches to a given state in the steady-state trellis are pruned, marking the two incoming branches to the given state in the steady-state trellis as not pruned so that the two incoming branches to the given state are restored to the steady-state trellis;
selecting a surviving path associated with the pruned trellis based at least in part on the set of path metrics; and
outputting a sequence of decisions associated with the surviving path.

14. The computer program product of claim 13, wherein the sequence of decisions includes one or more of the following a hard decision or a soft decision.

15. The computer program product of claim 13, wherein the constrained code includes at least one of the following: a maximum transition run (MTR) code or a run length limited (RLL) code.

16. The computer program product of claim 13, wherein the constrained code includes a concatenated code.

17. The computer program product of claim 13, wherein:
the constrained code includes a concatenated code; and
the computer instructions for obtaining the pruned trellis include computer instructions for coupling (1) a first state associated with an earliest time in the pruned trellis and (2) a second state, corresponding to the first state, associated with a latest time in the pruned trellis.

* * * * *